United States Patent
Nishida et al.

(10) Patent No.: US 6,669,748 B2
(45) Date of Patent: Dec. 30, 2003

(54) DISPERSION LIQUID OF SILICA PARTICLES FOR POLISHING, METHOD OF PRODUCING THE SAME, AND POLISHING AGENT

(75) Inventors: Hiroyasu Nishida, Kitakyushu (JP); Yoshinori Wakamiya, Kitakyushu (JP); Manabu Watanabe, Kitakyushu (JP); Michio Komatsu, Kitakyushu (JP)

(73) Assignee: Catalysts & Chemicals Industries Co., Ltd., Kawasaki (JP)

( * ) Notice: Subject to any disclaimer, the term of this patent is extended or adjusted under 35 U.S.C. 154(b) by 0 days.

(21) Appl. No.: 10/254,992

(22) Filed: Sep. 26, 2002

(65) Prior Publication Data

US 2003/0068893 A1 Apr. 10, 2003

(30) Foreign Application Priority Data

Oct. 1, 2001 (JP) .......................................... 2001-304958

(51) Int. Cl.[7] .............................. C09K 3/14; C09G 1/02; C09G 1/04
(52) U.S. Cl. .............................. 51/308; 106/3; 423/335; 423/338; 423/339
(58) Field of Search .............................. 51/308; 106/3; 438/692, 693; 423/335, 338, 339

(56) References Cited

U.S. PATENT DOCUMENTS 4,054,536 A * 10/1977 Schaefer et al. .............. 516/81
6,328,944 B1 * 12/2001 Mangold et al. ............ 423/278

FOREIGN PATENT DOCUMENTS

EP 0 846 742 6/1998

* cited by examiner

Primary Examiner—Michael Marcheschi
(74) Attorney, Agent, or Firm—Kanesaka & Takeuchi

(57) ABSTRACT

The present invention provides a dispersion liquid of silica particles for polishing with a low content of Na ions and also with a content of ions other than Na ions in a prespecified range. This dispersion liquid is a dispersion liquid of silica particles in which the silica particles having the average particle diameter in the range from 5 to 300 nm is dispersed, and a content of Na ions in the silica particle is less than 100 ppm, while a contents of ions other than Na ions is in the range from 300 ppm to 2 weight %.

5 Claims, No Drawings

DISPERSION LIQUID OF SILICA PARTICLES FOR POLISHING, METHOD OF PRODUCING THE SAME, AND POLISHING AGENT

TECHNICAL FIELD

The present invention relates to a dispersion liquid of silica particles for polishing with the excellent stability in dispersion, a method of producing the same, and a polishing agent comprising the dispersion liquid of silica particles.

BACKGROUND TECHNOLOGY

In a production process of a substrate with a semiconductor integrated circuit provided thereon, as irregularities or steps are generated, for instance, when the circuit is formed on a silicon wafer with metal such as copper, the metallic portion of the circuit is preferentially removed by polishing to eliminate the irregularities or steps on the surface thereof. When aluminum wiring is formed on a silicon wafer and such an oxide film as $SiO_2$ film is provided as an insulating film thereon, also irregularities are generated due to the wiring, so that the oxide film is polished for flattening.

As one of the polishing methods available for the purpose described above, there has been well known the chemical mechanical polishing method. In this method, a substrate with irregularities thereon is pressed to a rotating polishing pad and also the substrate itself is dipped into a slurry of a polishing agent, when particles for polishing included in the slurry is pressed to the substrate with irregularities thereon and as a result convex metallic sections on the substrate are removed and the surface is flattened. Further polishing in the same manner is performed also for flattening a surface of an oxide film formed on a substrate or for eliminating irregularities on an insulating film (oxide film) formed on a circuit.

In this polishing step, spherical particles each with the average particle diameter of about 200 nm such as those of fumed alumina or fumed silica are used as the particles for polishing. As the polishing agent, together with the particles for polishing as described above, oxidants such as hydrogen peroxide for improving the metal polishing speed, benzotriazole (BTA) for suppressing corrosion or oxidation of metal, or water-based slurry for polishing with a chemical polishing agent such as an acid added therein are used according to a type of the metal to be processed.

In the process for polishing a substrate as described above, it is required that a surface after having been subjected to polishing is a flat one without any irregularity or microscopic flaw, and further the polishing speed should be high. In addition, in the field of semiconductor materials, a degree of circuit integrated has been becoming higher and higher in association with the tendency for size reduction and more sophisticated performance of electric and electronic products, but sometimes the intended performances can not be achieved or troubles may occur due to impurities remaining in the transistor separation layers. Especially when any alkali metal, especially sodium is deposited on a surface of a polished semiconductor substrate or a polished oxide film, the dispersibility is very high, and the alkali metal is trapped in defective sections in the oxide film, and even if a circuit is formed on the semiconductor substrate, sometimes the circuit may be shorted, or the dielectric performance may become lower. Therefore the troubles as described above may occur under some conditions for use thereof or when the semiconductor substrate is used for a long time.

DISCLOSURE OF THE INVENTION

The present invention was made to solve the problems described above, and it is an object to provide a dispersion liquid of silica particles for polishing with a low content of Na ions and also with a specific range of content of ions other than Na ions, a method of producing the dispersion liquid, and a polishing agent comprising the dispersion liquid.

The present invention provides a dispersion liquid of silica particles for polishing with an average particle diameter in the range from 5 to 300 nm, and Na ion content in the silica particle is less than 100 ppm, while content of ions other than Na ions is in the range from 300 ppm to 2 weight %.

The method of producing the dispersion liquid of silica particles for polishing according to the present invention comprises the steps of adding an acidic silicic acid solution into a dispersion liquid of core particles and growing the core particles to obtain a dispersion liquid of silica particles, and the steps are performed to grow the particles under the conditions that a content of Na ions ($N_s$) defined by a number of Na ions per square meter of the core particle is less than $50 \times 10^{17}$ pieces/core particle's surface area($m^2$), that a content of ions ($N_k$) other than Na ions defined by a number of ions other than Na ions per square meter of the core particle is in the range from $5 \times 10^{17}$ to $2000 \times 10^{17}$ pieces/core particle's surface area($m^2$), and that the ratio of ($N_k$)/($N_s$) is 5 or more.

An alkali silicate should preferably be added to the dispersion liquid of core particles before the acidic silicic acid liquid is added thereto.

An polishing agent according to the present invention comprises the dispersion liquid of silica particles.

BEST MODE FOR CARRYING OUT THE INVENTION

Preferable embodiments of the present invention are described below.

1. Dispersion Liquid of Silica Particles for Polishing

A content of Na ions in a silica particle in the dispersion liquid of silica particles for polishing according to the present invention, when calculated as a content of Na in SiO2, is less than 100 ppm, preferably less than 50 ppm, and more preferably less than 20 ppm.

If the Na ion content in a silica particle exceeds 100 ppm, Na remains on a substrate to be polished when the particles are used as a polishing agent, and the residual Na may cause insulation fault or short circuitry in a circuit formed on the semiconductor substrate, which may in turn lower the dielectric constant of a film (insulating film) provided for insulation, and such troubles as increase in impedance, a slower response speed, and increase of power consumption may occur. Further the Na ions may move (disperse) and cause the troubles as described under some specific conditions or when used for a long time.

The silica particle includes ions other than Na ion such as monovalent cations of Li, K, Rb, Cs, $NH_4$ and others, and bivalent cations of Mg, Ca, Sr, Ba and others. A content of these ions other than those of Na is in the range from 300 ppm to 2 weight %, and preferably in the range from 300 ppm to 1 weight %.

When the content of ions other than Na ions is less than 300 ppm, a quantity of cations on a surface of the silica particle is too small and stability of the silica particle dispersion liquid is poor, which gives some negative effects for such use as the low workability with low cost performance, and even if it is used as a polishing agent or a polishing material, sometimes a sufficient polishing speed can not be obtained. When the content of ions other than Na ions is over 2 weight %, many ions other than Na ions remain on a surface of a substrate and/or an insulating film, and the troubles as described above may occur when it is used for a long time. Of the ions other than Na ions, cations of K, Rb, Cs, and $NH_4$ each having a larger ion diameter as compared to that of the Na ion are preferable because the ions seldom cause such troubles including insulation fault as described above.

The average particle diameter of the silica particles described above varies according to such factors as the required polishing speed and polishing precision, but it should preferably be in the range from 5 to 300 nm, and more preferably in the range from 10 to 200 nm. When the average particle diameter is less than 5 nm, the silica particle dispersion liquid will generally lack the stability, and further the particle diameter is too small to obtain a sufficient polishing speed. On the other hand, when the average particle diameter exceeds 300 nm, scratches may remain on surfaces of some specific types of substrates or insulating films, and it is impossible to obtain sufficient surface smoothness.

In the dispersion liquid of silica particles for polishing according to the present invention, the silica particles are generally dispersed in water and/or an organic solvent. The organic solvent used for this purpose is preferably such alcohols as methyl alcohol, ethyl alcohol, and isopropyl alcohol, and in addition such water-soluble organic solvents as ethers, esters, and ketone may be used in the present invention.

The concentration of silica particle dispersion liquid as described above, when calculated as that of $SiO_2$ (solid phase), should preferably be in the range from 5 to 50 weight %. When the concentration is less than 5 weight %, the concentration of silica particles in a polishing agent is too low to obtain a sufficient polishing speed, and on the other hand, when the concentration is over 50 weight %, the stability of the dispersion liquid will become lower, and in addition dry materials will be generated and deposited on a surface of a substrate during the process of supplying the dispersion liquid for polishing, which may cause generation of scratches.

2. Method of Producing the Dispersion Liquid of Silica Particles for Polishing

Any known method may be employed as a method of producing the dispersion liquid of silica particles for polishing so far as it is possible to obtain silica particles capable of being used as a polishing agent and also having contents of Na ions and ions other than Na ions in the ranges described above respectively. For instance, in the known method of producing a sol, a solution obtained by solving silica in potassium silicate (potash water glass) with a low Na content, or in such organic base as quarternary amine may be used as a raw material in place of the sodium silicate (sodium water glass) which is generally used as the raw material. Further the silica particles can be obtained by removing Na with such a material as an acid from silica particles produced by any known method.

With any of the methods described above, however, there are some restrictions over the raw materials used for production or over the production process, and in addition the cost performance is disadvantageously low. Also with the known production methods described above, especially in a case of large silica particles with the average particle diameter of 30 nm or more, sometimes it is impossible to stably obtain silica particles with the Na ion content of 100 ppm or less.

To overcome the problems as described above, in the method of producing the dispersion liquid of silica particles for polishing according to the present invention, in a process of adding an acidic silicic acid solution to a dispersion liquid of core particles for growing the core particles in the size to obtain a silica particle dispersion liquid, a content of sodium ions and that of other ions are controlled into specific ranges respectively for growing the core particles to obtain a desired silica particle dispersion liquid.

There is no specific restriction over the core particle dispersion liquid to be used in the present invention so long as the particles function as core particle, and a dispersion liquid of fine particles such as those of silica, alumina, zirconia, and silica alumina may be used for this purpose.

Especially sol of silica and sols of silica-based composite oxide as disclosed in Japanese Patent Laid-Open Publication No. HEI 5-132309 and Japanese Patent Laid-Open No. HEI 7-105522 are preferable because distribution of particle diameters is homogenous and silica particles for polishing with homogenous distribution of particle diameters can be obtained.

It is preferable to add an alkali silicate to the core particle dispersion liquid before an acidic silicic acid solution is added therein. When the alkali silicate is added beforehand, concentration of $SiO_2$ dissolved in the dispersant is set to a high level before the acidic silicic acid solution for particle growth is added, and therefore precipitation of silicic acid onto the core particles occurs quickly, and further pH of the dispersion liquid can easily be controlled in the range from 8 to 12, and more preferably in the range from 9.5 to 11.5. As the alkali silicate to be used in this process, it is preferable to use an alkali silicate other than sodium silicate (sodium water glass) such as potassium silicate (potash water glass) or a solution obtained by dissolving silica in such an organic base as a quarternary amine.

Further an alkali metal hydride other than NaOH, ammonium, and a quarternary ammonium hydride may be added therein according to the necessity. Further $Mg(OH)_2$ and such alkaline earth metal hydride as $Ca(OH)_2$, $Sr(OH)_2$, and $Ba(OH)_2$ may advantageously be used.

In the present invention, even if core particles are not dispersed beforehand, as the acidic silicic acid solution described later is added to an aqueous solution of alkali silicate, core particles are generated when silica concentration becomes sufficiently high, so that the core particle dispersion liquids as described above can advantageously be used.

The concentration of the core particle dispersion liquid varies according to a size of the core particles, but the concentration as calculated as that of $SiO_2$ should preferably be in the range from 0.005 to 20 weight %, and more preferably in the range from 0.01 to 10 weight %. If the concentration of core particle is less than 0.005 weight %, a portion or all of the core particles may be dissolved when the temperature for particle growth is made higher, and if all core particles are dissolved, the effect of using the core particle dispersion liquid can not be achieved. When a portion of the core particles is dissolved, diameters of the obtained particles are generally not homogenous, which sometimes makes it impossible to achieve the effect of using the core particle dispersion liquid. On the other hand, when the concentration of core particles exceeds 20 weight %, the speed of adding a silicic acid solution must be made higher to adjust an addition rate of the acidic silicic acid solution per core particle to the same level in a case of low concentration, but in this case, precipitation of the acidic silicic acid solution onto a surface of the core particle is too slow, and the acidic silicic acid solution may be gelatinized.

There is not specific restriction over an average particle diameter of the core particles so far as the desirable silica particles as described above can be obtained, but generally the average particle diameter should preferably be in the range from 2 to 280 rim, and further in the range from 3 to 100 nm. When the average particle diameter of core particles is less than 2 nm, although the circumstances vary according to a temperature or a concentration of the dispersion liquid as well as to a quantity of alkali, a portion or all of the core particles may be dissolved when the temperature is made higher for growing the core particles, and any of the troubles as described above may occur. Silica particles can be obtained even if the average particle diameter is less than 2 nm, but distribution of the particle diameters are apt to become inhomogeneous. On the other hand, as silica particles with the average particle diameter of 300 nm or more are not desired for producing the dispersion liquid according to the present invention, those with the average particle diameter of 280 nm or more are not preferable.

In the method according to the present invention, a content of Na ions ($N_s$) in the core particle dispersion liquid described above as defined by a number of Na ions per square meter of a surface area of the core particle is preferably less than $50 \times 10^{17}$ pieces/core particle's surface area($m^2$), and more preferably less than $20 \times 10^{17}$ pieces/core particle's surface area($m^2$). When the Na ion content ($N_s$) is more than $50 \times 10^{17}$ pieces/core particle's surface area($m^2$), even if there are many ions other than Na ions, the content of Na ions in the particles finally obtained is not less than 100 ppm, and the particles are not adapted to be used for polishing.

As for the content of ions other than Na ions ($N_k$) in the core particle dispersion liquid as defined by a number of ions other than Na ions in the core particle dispersion liquid per square meter of a surface area of the core particle should preferably be in the range from $5 \times 10^{17}$ to $2000 \times 10^{17}$ pieces/core particle's surface area($m^2$). When the content of ions other than Na ions ($N_k$) is less than $5 \times 10^{17}$ pieces/core particle's surface area($m^2$), as the content of ions other than Na ions is small, a quantity of ions other than Na ions existing on a surface of the core particle corresponding to OH bases thereon is small, so that, in the state where Na ions have been carried in and deposited from the acidic silicic acid solution described below on a surface of the core particle, the silicic acid is precipitated thereon to cause growth of core particles, and as a result sometimes the content of Na ions in the obtained silica particle may be over 100 ppm, which is not preferable. On the other hand, when the content of ions other than Na ions ($N_k$) is over $2000 \times 10^{17}$ pieces/core particle's surface area ($m^2$), a quantity of ions other than Na ions is more than that required for covering a surface of the core particle, and therefore the effect of suppressing in-take of Na ions as described above is not further enhanced, nor is further reduced a quantity of Na ions in the obtained silica particles. Further, the content of residual ions other than Na ions may be over 2 weight %, which is not preferable.

A ratio of the content of ions other than Na ions ($N_k$) to a ratio of Na ions ($N_s$), namely ($N_k$)/($N_s$) is required to be more than 5. If the ($N_k$)/($N_s$) ratio is less than 5, the Na ions existing corresponding to OH bases on a surface of the core particle are not sufficiently substituted by other ions, and as a result sometimes the content of Na ions in the obtained silica particle may be more than 100 ppm.

In the production method according to the present invention, a temperature of the core particle dispersion liquid is kept in the range from 50 to 200° C., more preferably in the range from 60 to 150° C., and the core particles are grown by continuously or intermittently adding the acidic silicic acid solution therein.

The acidic silicic acid solution can be obtained by removing Na ions with an ion exchange resin from a sodium silicate aqueous solution with the $SiO_2$ concentration in the range from 1 to 10 weight %, and more preferably in the range from 2 to 7 weight %. The $SiO_2$ concentration also in the acidic silicic acid solution is generally in the range from 1 to 10 weight %, and more preferably in the range from 2 to 7 weight %. It should be noted that use of such a material as potassium silicate is preferable, because in that case Na ions do not substantially exist in the acidic silicic acid solution and a content of Na in the obtained silica particle can be reduced.

A rate of adding the acidic silicic acid solution varies according to an average particle diameter of core particles or a concentration of core particles in the dispersion liquid, and should preferably be set to a level where fine particles other than core particles are not generated. Further the acidic silicic acid solution can be added in batch or repeatedly several times until silica particles having the desired average particle diameter are obtained.

After the acidic silicic acid solution is added, the mixture may be aged for about 0.5 to 5 hours under the temperature in the range from 70 to 150° C. When the aging as described above is performed, the Na ion content in the obtained silica particle may be further reduced with the particle diameter distribution becoming more homogeneous. Further it is possible to remove excessive ions by using an ultra filtration membrane or condensing or diluting the concentration to a required level according to the necessity. In addition, it is possible to obtain a silica particle dispersion liquid in which the aqueous solvent is substituted with an organic solvent by means of the ultra filtration membrane method or distillation method.

3. Polishing Agent

The polishing agent according to the present invention contains the dispersion liquid of silica particles for polishing. Generally water is used as a solvent for this dispersion liquid, but such alcohols as methyl alcohol, ethyl alcohol, isopropyl alcohol, or such water-soluble organic solvents as ethers, esters, and ketones may be used according to the necessity.

The concentration of silica particles for polishing in the polishing agent should preferably be in the range from 5 to 50 weight %, and more preferably in the range from 5 to 30 weight %. When the particle concentration is less than 5 weight %, the concentration is too low for some types of substrates or insulating films, so that the polishing speed is low and the productivity is low, and when the particle concentration is more than 50 weight %, stability of the polishing agent is not sufficient with the polishing speed or polishing efficiency not further improved, and further dry materials may be deposited in the step of supplying the dispersion liquid for the polishing processing, which may in turn generate scratches.

Hydrogen peroxide, acetate peroxide, urea peroxide, or a mixture thereof may be added to the polishing agent according to the polishing agent, if required. When the material to be polished is metal, it is expected that the polishing speed can be improved by adding the hydrogen peroxide or others.

Such organic acids as phthalic acid or citric acid or salts of these acids may be added as a complex forming agent to the polishing agent according to the present invention. Further for suppressing oxidation, such a material as benzotrianole (BTA) may be used. Further pH of the polishing agent can be adjusted by using an acid or a base. A surfactant or the like may be added for improving dispersibility or stability of the polishing agent.

The dispersion liquid of silica particles for polishing according to the present invention has a prespecified quantity of ions other than Na ions, so that the stability is quite excellent.

In the polishing agent according to the present invention, as a content of Na ions in the silica particle is low, so that Na does not remain on a surface of a polished semiconductor substrate or other processed work, and a high polishing speed can be obtained. Further a surface of the substrate is made smooth after polishing, and insulation fault or short circuitry due to residual Na never occurs. Further in the semiconductor substrate or other materials to be processed, a dielectric factor of the insulating film becomes lower with the impedance in the metal wiring increased, so that such troubles as lowering of the response speed and increase in power consumption never occur, and further any troubles due to movement of residual Na ions do not occur under any condition for use, or even if it is used for a long time.

EXAMPLES

Examples according to the present invention are described below, but it is to be noted that the present invention is not limited to these examples.

Example 1

Preparation of Dispersion Liquid of Silica Particles for Polishing (A)

Diluted water glass (with the $SiO_2$ concentration of 5 weight %) obtained by diluting water glass (produced by Dokai Kagaku K.K: JIS No.3 water glass with the $SiO_2$ concentration of 24 weight %) was dealkylated with an ion exchange resin to prepare 175.4 kg of acidic silicic acid solution (pH 2.2 with the $SiO_2$ concentration of 3 weight %)

6.07 kg or acidic silicate solution prepared as described above and 0.44 kg of KOH aqueous solution with the concentration of 20 weight % were mixed in 12.13 kg deionized water, and the mixture was heated to the temperature of 83° C. and aged for 30 minutes to prepare the core particle dispersion liquid (A). The average particle diameter of the core particles was 3.4 nm, and the content of Na ions was $0.105 \times 10^{17}$ pieces/core particle's surface area($m^2$), while the content of K ions was $64.4 \times 10^{17}$ pieces/core particle's surface area ($m^2$)

Then 169.3 kg of the acidic silicic acid solution prepared as described above was added to the core particle dispersion liquid over 17 hours, and the mixture was aged for 1 hour and cleaned and condensed with an ultra filtration membrane until the silica particle dispersion liquid was adjusted to pH 10 to prepare the silica particle dispersion liquid (A-1) with the $SiO_2$ concentration of 30 weight %. The average particle diameter of silica particles in the silica particle dispersion liquid (A-1) prepared as described above and contents of Na ions and K ions in the silica particle were analyzed, and the result were shown in Table 1.

Then the silica particle dispersion liquid (A-1) was subjected to ion exchange with an ion exchange resin to prepare a silica particle dispersion liquid (A-2). Contents of Na ions and K ions in the silica particle dispersion liquid (A-2) was analyzed, and the result were shown also in Table 1.

Further, the silica particle dispersion liquid (A-2) was subjected to hydrothermal processing for 11 hours in an autoclave under the temperature of 150° C. and was subjected to ion exchange with an ion exchange resin to prepare the silica particle dispersion liquid (A-3). Contents of Na ions and K ions in the silica particle in the silica particle dispersion liquid (A-3) prepared as described above were analyzed, and the result were shown also in Table 1.

Preparation of a Polishing Agent (A)

The $SiO_2$ concentration of each silica particle dispersion liquid obtained as described above was adjusted to 20 weight %, and a KOH aqueous solution with the concentration of 20 weight % was added therein to adjust the pH of the dispersion liquid to 10.5 to prepare polishing agent (A-1), polishing agent (A-2), and polishing agent (A-3).

A silicon wafer with a thermally-oxidized film formed thereon (for a polishing test; 30 mm×30 mm) was used as a substrate to be polished and set in a polishing device (made by Nano Factor Inc. ; NF300), and the polishing test was performed by feeding the polishing agent (A-1) at the rate of 1 ml/sec for 30 seconds under the conditions: substrate load of 0.12 MPa and table rotation speed: 30 rpm. Similarly tested substrates were polished by using the polishing agent (A-2) and polishing agent (A-3) to compute the polishing speed by checking thicknesses of the polished substrates before and after polishing. Further surface smoothness of each of the polished substrates was assessed, and the result were shown in Table 1. It is to be noted that the polishing speed shown in Table 1 was that obtained by polishing with the polishing agent (A-3). The surface smoothness was assessed by monitoring a surface of each polished substrate with an optical microscope, and the assessment was made referring to the following criteria.

◯: Flaws and scratches observed before polishing have been substantially eliminated, and the surface is smooth.

Δ: Flaws and scratches observed before polishing have been reduced by half, and the surface is smooth.

X: Flaws and scratches observed before polishing have been reduced a little, but the surface is still rough.

Example 2

Preparation of Dispersion Liquid of Silica Particles for Polishing (B)

Diluted water glass (with the $SiO_2$ concentration of 5 weight %) obtained by diluting the potassium silicate solution (potassium water glass with the $SiO_2$ concentration of 21 weight %) prepared by dissolving high purity silica powder (produced by Mitsubishi Kagaku K.K.); Na content: 0.01 ppm) in KOH was dealkylated with an ion exchange resin to prepare 175.4 kg of the acidic silicic acid solution (pH: 2.2, the $SiO_2$ concentration: 3 weight %).

6.07 kg of the acidic silicic acid solution prepared as described above and 0.44 kg of KOH aqueous solution with the concentration of 20 weight % were added in 12.13 kg of deionized water, and the mixture was heated to 83° C. and was aged for 30 minutes to obtain the core particle dispersion liquid (B). The average particle diameter of the core particles was 3.4 nm, and the Na ion content was $0.024 \times 10^{17}$ pieces/core particle's surface area($m^2$), while the K ion content was $64.4 \times 10^{17}$ pieces/core particle's surface area ($m^2$).

Then 169. 3 kg of the acidic silicic acid solution prepared as described above was added to the core particle dispersion liquid over 17 hours, and the mixture was aged for one hour, then cleaned and condensed with an ultra filtration membrane until the silica particle dispersion liquid was adjusted to pH 10 to obtain the silica particle dispersion liquid (B-1)

with the $SiO_2$ concentration of 30 weight %. Further like in Example 1, the silica particle dispersion liquid (B-2) having been subjected to ion exchange and the silica particle dispersion liquid (B-3) having been subjected to hydrothermal processing as well as to ion exchange were prepared.

Preparation of a Polishing Agent (B)

Polishing agent (B-1), polishing agent (B-2), and polishing agent (B-3) were prepared in the same manner as that in Example 1 excluding the point that the silica particle dispersion liquids (B-1), (B-2), and (B-3) were used as dispersion liquids for polishing, and substrates were polished with the polishing agents above to assess irregularities on a surface of each substrate before and after polishing as well as the polishing speed.

Example 3

Preparation of Dispersion Liquid of Silica Particles for Polishing (C)

39.3 g of sol of silica (produced by CCIC ; SI-50, average particle diameter: 25 nm, $SiO_2$ concentration: 48 weight %) was mixed in 3494 g of deionized water, and further 25.8 g of the potassium silicate aqueous solution prepared in Example 2 was added to the mixture to obtain the core particle dispersion liquid (C). pH of the core particle dispersion liquid (C) was 11.3, and the Na ion content was $15.0 \times 10^{17}$ pieces/core particle's surface area($m^2$), while the K ion content was $101 \times 10^{17}$ pieces/core particle's surface area($m^2$).

The core particle dispersion liquid (C) was heated to 95° C., and 3713 g of the acidic silicic acid solution obtained as in Example 1 was added therein over 15 hours. Then the mixture was aged for one hour and cleaned with an ultra filtration membrane until the silica particle dispersion liquid was adjusted to pH 10, and then was condensed to obtain the silica particle dispersion liquid (C-1) with the $SiO_2$ concentration of 30 weight %. Further like in Example 1, the silica particle dispersion liquid (C-2) having been subjected to ion exchange processing and the silica particle dispersion liquid (C-3) having been subjected to hydrothermal processing as well as to ion exchange were prepared.

Preparation of a Polishing Agent (C)

Polishing agent (C-1), polishing agent (C-2), and polishing agent (C-3) were prepared in the same manner as that in Example 1 excluding the point that the silica particle dispersion liquids (C-1), (C-2), and (C-3) were used as dispersion liquids for polishing. Substrates were polished with the polishing agents above, and irregularities on a surface of each tested substrate before and after polishing and the polishing speed were assessed.

Example 4

Preparation of Dispersion Liquid of Silica Particles for Polishing (D)

1.16 kg of the silica particle dispersion liquid (B-2) prepared in Example 2 (with the average particle diameter of 23 nm and the $SiO_2$ concentration of 30 weight %) was added in 10.45 kg of deionized water, and 635 g of potassium silicate solution prepared in Example 2 was added in the mixture to obtain the core particle dispersion liquid (D). pH of the core particle dispersion liquid (D) was 11.4, and the Na ion content was $0.005 \times 10^{17}$ pieces/core particle's surface area($m^2$), while the K ion content was $116 \times 10^{17}$ pieces/core particle's surface area($m^2$).

The core particle dispersion liquid (D) was heated to 95° C., and 88.7 kg of acidic silicic acid solution prepared in the same manner as that in Example 2 was added to the dispersion liquid over 15 hours. Then the mixture was aged for one hour, and was cleaned with an ultra filtration membrane until the silica particle dispersion liquid was adjusted to pH 10, and was condensed to obtain the silica particle dispersion liquid (D-1) with the $SiO_2$ concentration of 30 weight %. Further like in Example 1, the silica particle dispersion liquid (D-2) having been subjected to the ion exchange processing and the silica particle dispersion liquid (D-3) having been subjected to hydrothermal processing as well as to ion exchange were prepared.

Preparation of a Polishing Agent (D)

Polishing agent (D-1), polishing agent (D-2), and polishing agent (D-3) were prepared in the same manner as that in Example 1 excluding the point that the silica particle dispersion liquids (D-1), (D-2), and (D-3) were used as dispersion liquids for polishing. Substrates were polished with the polishing agents above, and irregularities on a surface of each tested substrate before and after polishing and the polishing speed were assessed.

Example 5

Preparation of Dispersion Liquid of Silica Particles for Polishing (E)

175.4 kg of acidic silicic acid solution (pH 2.2, and $SiO_2$ concentration of 3 weight %) was prepared in the same manner as that in Example 1.

2.0 kg of the silica particle dispersion liquid (B-2) prepared in Example 2 and 0.265 kg of KOH aqueous solution with the concentration of 30 weight % were mixed in 19.82 kg of deionized water, and the mixture was heated to 87° C. and aged for 30 minutes to obtain the core particle dispersion liquid (E). The average particle diameter of core particles was 23 nm, and the Na ion content was $0.056 \times 10^{17}$ pieces/core particle's surface area($m^2$), while the K ion content was $121 \times 10^{17}$ pieces/core particle's surface area($m^2$).

Then 161.8 kg of the acidic silicic acid solution prepared as described above was added to the core particle dispersion liquid over 15 hours and the mixture was aged for one hour and cleaned and condensed with an ultra filtration membrane until the silica particle dispersion liquid was adjusted to pH 10 to obtain the silica particle dispersion liquid (E-1) with the $SiO_2$ concentration of 30 weight %. Further like in Example 1, the silica particle dispersion liquid (E-2) having been subjected to the ion exchange processing and the silica particle dispersion liquid (E-3) having been subjected to hydrothermal processing as well as to ion exchange were prepared.

Preparation of a Polishing Agent (E)

Polishing agent (E-1), polishing agent (E-2), and polishing agent (E-3) were prepared in the same manner as that in Example 1 excluding the point that the silica particle dispersion liquids (E-1), (E-2), and (E-3) were used as dispersion liquids for polishing. Substrates were polished with the polishing agents above, and irregularities on a surface of each tested substrate before and after polishing and the polishing speed were assessed.

Comparative Example 1

Preparation of Dispersion Liquid of Silica Particles for Polishing (F)

The core particle dispersion liquid (F) was prepared in the same manner as that in Example 1 excluding the point that 0.44 kg of NaOH aqueous solution with the concentration of 20 weight % was mixed therein in place of the KOH aqueous solution in Example 1. The average particle diameter of the core particles was 3.4 nm, and the Na ion content was $0.657 \times 10^{17}$ pieces/core particle's surface area(m$^2$), while ions other than Na ions were not present.

The core particle dispersion liquid (F) was heated to 95° C., and the 33 kg of acidic silicic acid solution prepared in the same manner as that in Example 1 was added to the dispersion liquid over 17 hours, and was aged for one hour. Then the mixture was cleaned with an ultra filtration filter until the silica particle dispersion liquid was adjusted to pH 10, and was then condensed to obtain the silica particle dispersion liquid (F-1) with the SiO$_2$ concentration of 30 weight %. Further the silica particle dispersion liquid (F-2) having been subjected to the ion exchange processing and the silica particle dispersion liquid (F-3) having been subjected to hydrothermal processing as well as to ion exchange were prepared in the same manner as that in Example 1.

Preparation of a Polishing Agent (F)

Polishing agent (F-1), polishing agent (F-2), and polishing agent (F-3) were prepared in the same manner as that in Example 1 excluding the point that the silica particle dispersion liquids (F-1), (F-2), and (F-3) were used as dispersion liquids for polishing. Substrates were polished with the polishing agents above, and irregularities on a surface of each tested substrate before and after polishing and the polishing speed were assessed.

Comparative Example 2

Preparation of Dispersion Liquid of Silica Particles for Polishing (G)

36.8 g of sol of silica (produced by CCIC : SI-50, average particle diameter: 25 nm, and SiO$_2$ concentration: 48 concentration %) was mixed in 3498 g of deionized water, and 23.7 g of sodium silicate aqueous solution (with the SiO$_2$ concentration of 24 weight %) was added to the mixture to obtain the core particle dispersion liquid (G). pH of the core particle dispersion liquid (G) was 11.4, and the Na ion content was $144 \times 10^{17}$ pieces/core particle's surface area (m$^2$), while ions other than Na ions was substantially not present.

The core particle dispersion liquid (G) was heated to 95° C., and 35.6 kg of acidic silicic acid solution prepared in the same manner as that in Example 1 was added to the dispersion liquid (G) over 15 hours. Then the mixture was aged for one hour and was cleaned with an ultra filtration membrane until the silica particle dispersion liquid was adjusted to pH 10, and then was condensed to obtain the silica particle dispersion liquid (G-1) with the SiO$_2$ concentration of 30 weight %. Further the silica particle dispersion liquid (G-2) having been subjected to the ion exchange processing and the silica particle dispersion liquid (G-3) having been subjected to hydrothermal processing as well as to ion exchange were prepared in the same manner as that in Example 1.

Preparation of a Polishing Agent (G)

Polishing agent (G-1), polishing agent (G-2), and polishing agent (G-3) were prepared in the same manner as that in Example 1 excluding the point that the silica particle dispersion liquids (G-1), (G-2), and (G-3) were used as dispersion liquids for polishing. Substrates were polished with the polishing agents above, and irregularities on a surface of each tested substrate before and after polishing and the polishing speed were assessed.

TABLE 1

|  |  | Example 1 | Example 2 | Example 3 | Example 4 |
|---|---|---|---|---|---|
| [Core particle dispersion liquid] | | | | | |
| Av p. diameter | (nm) | 3.4 | 3.4 | 25 | 23 |
| Concentration | (wt %) | 2.8 | 2.8 | 0.5 | 0.5 |
| Alkali silicate |  | K, SiO$_2$ | K, SiO$_2$ | K, SiO$_2$ | K, SiO$_2$ |
| Na ions | (N$_s$) × 10$^{17}$ | 0.105 | 0.024 | 15.0 | 0.005 |
| Other ions | (N$_k$) × 10$^{17}$ | 64.4 | 64.4 | 101 | 116 |
| (N$_k$)/(N$_s$) |  | 613 | 2683 | 6.7 | 23200 |
| pH |  | 11.4 | 11.2 | 11.3 | 11.4 |
| [Acidic silicic acid solution] | | | | | |
| SiO$_2$ conc. | (wt %) | 3.0 | 2.8 | 2.8 | 2.8 |
| Adding speed | (kg/hr) | 9.96 | 9.96 | 0.28 | 5.91 |
| Na ion conc. | (ppm) | 13 | 3 | 3 | 3 |
| [Silica particle dispersion liquid] | | | | | |
| Aging temp. | (° C.) | 83 | 83 | 87 | 87 |
| Aging period | (hr) | 1 | 1 | 1 | 1 |
| Av p. diameter | (nm) | 23 | 23 | 44 | 45 |
| Disp. Liq. (−1) *1 | (ppm) | 75/2500 | 35/2250 | 1170/2500 | 9/1500 |
| Disp. Liq. (−2) *1 | (ppm) | 23/1000 | 13/800 | 120/750 | 0.6/500 |
| Disp. Liq. (−3) *1 | (ppm) | 9/800 | 5/500 | 21/650 | 0.2/450 |
| [Polishing agent] | | | | | |
| Smoothness (−1) |  | ◯ | ◯ | △ | ◯ |
| Smoothness (−2) |  | ◯ | ◯ | ◯ | ◯ |
| Smoothness (−3) |  | ◯ | ◯ | ◯ | ◯ |
| Polish speed (−3) | (Å/min) | 2200 | 2100 | 3300 | 3150 |

*1 indicates a content of Na ions when used as a numerator, and a content of other ions when used as a denominator.

TABLE 2

|  |  | Example 5 | Comp. Ex 1 | Comp. Ex 2 |
|---|---|---|---|---|
| [Core particle dispersion liquid] | | | | |
| Av p. diameter | (nm) | 23 | 3.4 | 25 |
| Concentration | (wt %) | 0.5 | 2.8 | 0.5 |
| Alkali silicate |  | K, SiO$_2$ | Na, SiO$_2$ | Na, SiO$_2$ |
| Na ions | (N$_s$) × 10$^{17}$ | 0.056 | 0.657 | 144 |
| Other ions | (N$_k$) × 10$^{17}$ | 121 | — | — |
| (N$_k$)/(N$_s$) |  | 2161 | 0 | 0 |
| pH |  | 11.2 | 11.2 | 11.2 |
| [Acidic silicic acid solution] | | | | |
| SiO$_2$ conc. | (wt %) | 3.0 | 4.7 | 4.7 |
| Adding speed | (kg/hr) | 9.90 | 2.2 | 2.37 |
| Na ion conc. | (ppm) | 13 | 13 | 13 |
| [Silica particle dispersion liquid] | | | | |
| Aging temp. | (° C.) | 87 | 83 | 87 |
| Aging period | (hr) | 1 | 1 | 1 |
| Av p. diameter | (nm) | 44 | 25 | 45 |
| Disp. Liq. (−1) *1 | (ppm) | 50/2100 | 4270/— | 4370/— |
| Disp. Liq. (−2) *1 | (ppm) | 9/1100 | 800/— | 800/— |
| Disp. Liq. (−3) *1 | (ppm) | 6/850 | 300/— | 300/— |
| [Polishing agent] | | | | |
| Smoothness (−1) |  | ◯ | △ | △ |
| Smoothness (−2) |  | ◯ | △ | △ |
| Smoothness (−3) |  | ◯ | ◯ | ◯ |
| Polish speed (−3) | (Å/min) | 3200 | 1850 | 2700 |

What is claimed is:

1. A dispersion liquid for polishing comprising: silica particles with an average particle diameter in a range from 5 to 300 nm, said silica particles containing Na ions less than 100 ppm and at least one kind of ions selected from the group consisting of Li, K, Rb, Cs, $NH_4$, Mg, Ca, Sr, Ba in a range from 300 ppm to 2 weight %.

2. A method of producing a dispersion liquid of silica particles for polishing by adding an acidic silicic acid solution in a dispersion liquid of core particles for growing the core particles, wherein a content of Na ions ($N_s$) as defined by a number of Na ions per square meter of a surface area of the core particle is less than $50 \times 10^{17}$ pieces/core particle's surface area($m^2$) and a content of ions other than Na ions ($N_k$) as defined by a number of ions other than Na ions in the core particle dispersion liquid per square meter of a surface area of the core particle is in a range from $5 \times 10^{17}$ to $2000 \times 10^{17}$ pieces/core particle's surface area($m^2$), and also wherein a ratio of ($N_k/N_s$) is 5 or more.

3. A method of producing a dispersion liquid of silica particles for polishing according to claim 2, wherein an alkali silicate is added to the core particle dispersion liquid before the acidic silicic acid solution is added.

4. A polishing agent containing the dispersion liquid of silica particles according to claim 1.

5. A dispersion liquid according to claim 1, wherein said at least one kind of ions is a cation selected from the group consisting of K, Rb, Cs and $NH_4$.

* * * * *